United States Patent
Mckinzie, III et al.

(10) Patent No.: US 7,711,337 B2
(45) Date of Patent: May 4, 2010

(54) ADAPTIVE IMPEDANCE MATCHING MODULE (AIMM) CONTROL ARCHITECTURES

(75) Inventors: William E. Mckinzie, III, Fulton, MD (US); Heinz Bachmann, Stow, MA (US); Greg Mendolia, Nashua, NH (US)

(73) Assignee: Paratek Microwave, Inc., Nashua, NH (US)

( * ) Notice: Subject to any disclaimer, the term of this patent is extended or adjusted under 35 U.S.C. 154(b) by 436 days.

(21) Appl. No.: 11/653,639

(22) Filed: Jan. 16, 2007

(65) Prior Publication Data

US 2007/0197180 A1   Aug. 23, 2007

Related U.S. Application Data

(60) Provisional application No. 60/758,862, filed on Jan. 14, 2006.

(51) Int. Cl.
*H04B 1/06* (2006.01)
*H04B 7/00* (2006.01)

(52) U.S. Cl. .............. 455/248.1; 455/67.14; 455/67.13; 455/77; 455/87; 455/178.1

(58) Field of Classification Search .............. 455/248.1, 455/67.14, 67.13, 77, 87, 178.1, 73, 83, 13.3, 455/67.11, 169.1, 182.3, 192.3, 197.2, 340 C
See application file for complete search history.

(56) References Cited

U.S. PATENT DOCUMENTS

| | | | |
|---|---|---|---|
| 2,745,067 A | 5/1956 | Virgil et al. |
| 3,117,279 A | 1/1964 | Ludvigson et al. |
| 3,160,832 A | 12/1964 | Beitman et al. |
| 3,390,337 A | 6/1968 | Beitman |
| 3,443,231 A | 5/1969 | Roza |
| 3,509,500 A | 4/1970 | McNair et al. |
| 3,571,716 A | 3/1971 | Hill |
| 3,590,385 A | 6/1971 | Sabo |
| 3,601,717 A | 8/1971 | Kuecken |

(Continued)

FOREIGN PATENT DOCUMENTS

EP   0909024   12/1999

(Continued)

OTHER PUBLICATIONS

Qiao et al., "Measurement of Antenna Load Impedance for power Amplifiers"; The Department of Electrical and Computer Engineering, University of California, San Diego; 14 pages article, Sep. 13, 2004.

(Continued)

*Primary Examiner*—Pablo N Tran
(74) *Attorney, Agent, or Firm*—Eduardo Guntin; Akerman Senterfitt

(57) ABSTRACT

An embodiment of the present invention an apparatus, comprising an adaptive impedance matching module (AIMM) adapted to minimize the magnitude of an input reflection coefficient seen at an $RF_{in}$ port under boundary conditions of a variable load impedance $Z_L$, a tuner connected to the AIMM and including a plurality of variable reactance networks with independent control signals, wherein node voltages are sampled within the tuner; and a microcontroller or digital signal processor (DSP) calculates complex reflection coefficient information from the sampled voltages, the microcontroller or DSP providing a coarse and fine tune function that feeds bias signals to control impedance matching.

18 Claims, 8 Drawing Sheets

U.S. PATENT DOCUMENTS

| | | |
|---|---|---|
| 3,794,941 A | 2/1974 | Templin |
| 3,919,644 A | 11/1975 | Smolka |
| 3,990,024 A | 11/1976 | Hou |
| 3,995,237 A | 11/1976 | Brunner |
| 4,186,359 A | 1/1980 | Kaegebein |
| 4,201,960 A | 5/1980 | Skutta et al. |
| 4,227,256 A | 10/1980 | O'Keefe |
| 4,493,112 A | 1/1985 | Bruene |
| 4,799,066 A | 1/1989 | Deacon |
| 5,032,805 A | 7/1991 | Elmer |
| 5,142,255 A | 8/1992 | Chang |
| 5,195,045 A | 3/1993 | Keane |
| 5,200,826 A | 4/1993 | Seong |
| 5,212,463 A | 5/1993 | Babbitt |
| 5,258,728 A | 11/1993 | Taniyoshi |
| 5,301,358 A | 4/1994 | Gaskill |
| 5,307,033 A | 4/1994 | Koscica |
| 5,312,790 A | 5/1994 | Sengupta |
| 5,334,958 A | 8/1994 | Babbitt |
| 5,409,889 A | 4/1995 | Das |
| 5,427,988 A | 6/1995 | Sengupta |
| 5,430,417 A | 7/1995 | Martin |
| 5,446,447 A | 8/1995 | Carney |
| 5,451,567 A | 9/1995 | Das |
| 5,451,914 A | 9/1995 | Stengel |
| 5,457,394 A | 10/1995 | McEwan |
| 5,472,935 A | 12/1995 | Yandrofski |
| 5,479,139 A | 12/1995 | Koscica |
| 5,486,491 A | 1/1996 | Sengupta |
| 5,496,795 A | 3/1996 | Das |
| 5,502,372 A | 3/1996 | Quan |
| 5,524,281 A * | 6/1996 | Bradley et al. ............ 455/67.15 |
| 5,561,407 A | 10/1996 | Koscica |
| 5,564,086 A | 10/1996 | Cygan |
| 5,593,495 A | 1/1997 | Masuda |
| 5,635,433 A | 6/1997 | Sengupta |
| 5,635,434 A | 6/1997 | Sengupta |
| 5,640,042 A | 6/1997 | Koscica |
| 5,679,624 A | 10/1997 | Das |
| 5,689,219 A | 11/1997 | Piirainen |
| 5,693,429 A | 12/1997 | Sengupta |
| 5,694,134 A | 12/1997 | Barnes |
| 5,699,071 A | 12/1997 | Urakami |
| 5,766,697 A | 6/1998 | Sengupta |
| 5,778,308 A | 7/1998 | Sroka et al. |
| 5,786,727 A | 7/1998 | Sigmon |
| 5,830,591 A | 11/1998 | Sengupta |
| 5,846,893 A | 12/1998 | Sengupta |
| 5,874,926 A | 2/1999 | Tsuru |
| 5,886,867 A | 3/1999 | Chivukula |
| 5,990,766 A | 11/1999 | Zhang |
| 6,009,124 A | 12/1999 | Smith |
| 6,020,787 A | 2/2000 | Kim |
| 6,029,075 A | 2/2000 | Das |
| 6,045,932 A | 4/2000 | Jia |
| 6,061,025 A | 5/2000 | Jackson |
| 6,074,971 A | 6/2000 | Chiu |
| 6,096,127 A | 8/2000 | Dimos |
| 6,100,733 A | 8/2000 | Dortu |
| 6,101,102 A | 8/2000 | Brand et al. |
| 6,133,883 A | 10/2000 | Munson |
| 6,377,142 B1 | 4/2002 | Chiu |
| 6,377,217 B1 | 4/2002 | Zhu |
| 6,377,440 B1 | 4/2002 | Zhu |
| 6,404,614 B1 | 6/2002 | Zhu |
| 6,414,562 B1 | 7/2002 | Bouisse et al. |
| 6,466,774 B1 | 10/2002 | Okabe |
| 6,492,883 B2 | 12/2002 | Liang |
| 6,514,895 B1 | 2/2003 | Chiu |
| 6,525,630 B1 | 2/2003 | Zhu |
| 6,531,936 B1 | 3/2003 | Chiu et al. |
| 6,535,076 B2 | 3/2003 | Partridge |
| 6,535,722 B1 | 3/2003 | Rosen |
| 6,538,603 B1 | 3/2003 | Chen |
| 6,556,102 B1 | 4/2003 | Sengupta |
| 6,570,462 B2 * | 5/2003 | Edmonson et al. ......... 333/17.3 |
| 6,590,468 B2 | 7/2003 | du Toit |
| 6,590,541 B1 | 7/2003 | Schultze |
| 6,597,265 B2 | 7/2003 | Liang |
| 6,657,595 B1 | 12/2003 | Philips |
| 6,710,651 B2 | 3/2004 | Forrester |
| 6,737,179 B2 | 5/2004 | Sengupta |
| 6,759,918 B2 | 7/2004 | du Toit |
| 6,765,540 B2 | 7/2004 | Toncich |
| 6,774,077 B2 | 8/2004 | Sengupta |
| 6,795,712 B1 | 9/2004 | Vakilian |
| 6,825,818 B2 | 11/2004 | Toncich |
| 6,845,126 B2 | 1/2005 | Dent |
| 6,859,104 B2 | 2/2005 | Toncich |
| 6,862,432 B1 | 3/2005 | Kim |
| 6,864,757 B2 | 3/2005 | Du Toit |
| 6,868,260 B2 | 3/2005 | Jagielski |
| 6,905,989 B2 | 6/2005 | Ellis |
| 6,907,234 B2 | 6/2005 | Karr |
| 6,920,315 B1 | 7/2005 | Wilcox |
| 6,946,847 B2 | 9/2005 | Nishimori |
| 6,961,368 B2 | 11/2005 | Dent |
| 6,965,837 B2 | 11/2005 | Vintola |
| 6,993,297 B2 | 1/2006 | Smith |
| 7,009,455 B2 | 3/2006 | Toncich |
| 7,071,776 B2 | 7/2006 | Forrester |
| 7,113,614 B2 | 9/2006 | Rhoads |
| 7,151,411 B2 | 12/2006 | Martin |
| 7,176,845 B2 | 2/2007 | Fabrega-Sanchez |
| 7,180,467 B2 | 2/2007 | Fabrega-Sanchez |
| 7,221,327 B2 | 5/2007 | Toncich |
| 7,339,527 B2 | 3/2008 | Sager |
| 7,426,373 B2 | 9/2008 | Clingman |
| 7,535,312 B2 | 9/2008 | McKinzie |
| 2002/0191703 A1 | 12/2002 | Ling |
| 2002/0193088 A1 | 12/2002 | Jung |
| 2003/0232607 A1 | 12/2003 | le Bars |
| 2004/0009754 A1 | 1/2004 | Smith, Jr. |
| 2004/0137950 A1 | 7/2004 | Bolin |
| 2004/0202399 A1 | 10/2004 | Kochergin |
| 2004/0257293 A1 | 12/2004 | Friedrich |
| 2005/0042994 A1 | 2/2005 | Otaka |
| 2005/0093624 A1 | 5/2005 | Forrester |
| 2005/0215204 A1 | 9/2005 | Wallace |
| 2005/0282503 A1 * | 12/2005 | Onno et al. .................. 455/78 |
| 2006/0160501 A1 * | 7/2006 | Mendolia et al. ........... 455/125 |
| 2006/0183442 A1 | 8/2006 | Chang |
| 2006/0281423 A1 | 12/2006 | Caimi |
| 2007/0013483 A1 | 1/2007 | Stewart |
| 2007/0042734 A1 | 2/2007 | Ryu |
| 2007/0080888 A1 | 4/2007 | Mohamadi |
| 2007/0197180 A1 | 8/2007 | McKinzie |
| 2008/0055016 A1 | 3/2008 | Morris |
| 2008/0158076 A1 | 7/2008 | Walley |

FOREIGN PATENT DOCUMENTS

| | | |
|---|---|---|
| JP | 03276901 | 8/1998 |
| JP | 10209722 | 8/1998 |

OTHER PUBLICATIONS

Qiao et al., "Antenna Impedance Mismatch Measurement and Correction for Adaptive CDMA Transceivers", IEEE, 2005, 4 pages article.

* cited by examiner

ADAPTIVE IMPEDANCE MATCHING MODULE (AIMM) CONTROL ARCHITECTURES

CROSS REFERENCE TO RELATED APPLICATIONS

This application claims the benefit of Provisional Patent Application Ser. No. 60/758,862, filed Jan. 14, 2006 entitled "TECHNIQUES FOR ADAPTIVE IMPEDANCE MATCHING", by McKinzie et al.

BACKGROUND

Mobile communications has become vital throughout society. Not only is voice communications prevalent, but also the need for mobile data communications is enormous. Further, the efficiency of RF systems is vital to mobile communications, and becomes even more critical when the antenna efficiency of an embedded electrically small antenna undergoes changes in its environment. Efficient RF power transfer, or good impedance matching, is also vital between RF subsystems, such as at the input to an antenna port, between filters, at the output stages of power amplifiers, and even inter-stage matching between amplifier stages. Impedance matching networks are important as components of wireless communications and may be used in conjunction with various devices and systems, for example, a transmitter, a receiver, a transceiver, a transmitter-receiver, a wireless communication station, a wireless communication device, a wireless Access Point (AP), a modem, a wireless modem, a Personal Computer (PC), a desktop computer, a mobile computer, a laptop computer, a notebook computer, a tablet computer, a server computer, a handheld computer, a handheld device, a Personal Digital Assistant (PDA) device, a handheld PDA device, a network, a wireless network, a Local Area Network (LAN), a Wireless LAN (WLAN), a Metropolitan Area Network (MAN), a Wireless MAN (WMAN), a Wide Area Network (WAN), a Wireless WAN (WWAN), devices and/or networks operating in accordance with existing IEEE 802.11, 802.11a, 802.11b, 802.11e, 802.11g, 802.11h, 802.11i, 802.11n, 802.16, 802.16d, 802.16e standards and/or future versions and/or derivatives and/or Long Term Evolution (LTE) of the above standards, a Personal Area Network (PAN), a Wireless PAN (WPAN), units and/or devices which are part of the above WLAN and/or PAN and/or WPAN networks, one way and/or two-way radio communication systems, cellular radio-telephone communication systems, a cellular telephone, a wireless telephone, a Personal Communication Systems (PCS) device, a PDA device which incorporates a wireless communication device, a Multiple Input Multiple Output (MIMO) transceiver or device, a Single Input Multiple Output (SIMO) transceiver or device, a Multiple Input Single Output (MISO) transceiver or device, a Multi Receiver Chain (MRC) transceiver or device, a transceiver or device having "smart antenna" technology or multiple antenna technology, or the like. Some embodiments of the invention may be used in conjunction with one or more types of wireless communication signals and/or systems, for example, Radio Frequency (RF), Frequency-Division Multiplexing (FDM), Orthogonal FDM (OFDM), Time-Division Multiplexing (TDM), Time-Division Multiple Access (TDMA), Extended TDMA (E-TDMA), General Packet Radio Service (GPRS), Extended GPRS, Code-Division Multiple Access (CDMA), Wideband CDMA (WCDMA), CDMA 2000, Multi-Carrier Modulation (MDM), Discrete Multi-Tone (DMT), Bluetooth®, ZigBee™, or the like. Embodiments of the invention may be used in various other apparatuses, devices, systems and/or networks. All of the above RF systems have impedance matching networks whose load impedance may vary stochastically with time, temperature, power levels, component values, and many other real world parameters.

Thus, a strong need in the industry exists for adaptive impedance matching module (AIMM) control architectures.

BRIEF DESCRIPTION OF THE DRAWINGS

The present invention is described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION

Figure 1:
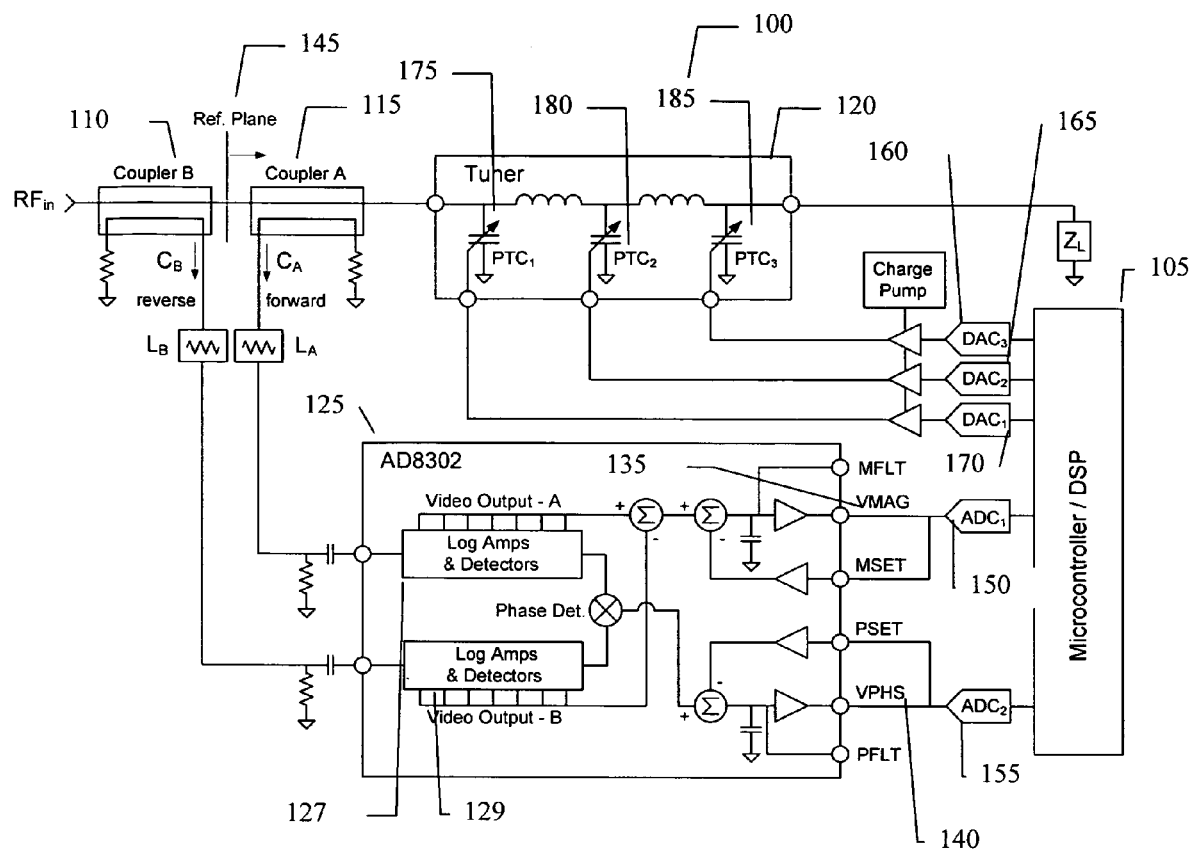
FIG. 1 is a schematic diagram showing simultaneous measurements of magnitude and phase for both forward and reflected waves of one embodiment of the present invention.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Some portions of the detailed description that follows are presented in terms of algorithms and symbolic representations of operations on data bits or binary digital signals within a computer memory. These algorithmic descriptions and representations may be the techniques used by those skilled in the data processing arts to convey the substance of their work to others skilled in the art.

An algorithm is here, and generally, considered to be a self-consistent sequence of acts or operations leading to a desired result. These include physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers or the like. It should be understood, however, that all of these and similar terms are to be associated with the appropriate physical quantities and are merely convenient labels applied to these quantities.

Unless specifically stated otherwise, as apparent from the following discussions, it is appreciated that throughout the specification discussions utilizing terms such as "processing," "computing," "calculating," "determining," or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. An apparatus may be specially constructed for the desired purposes, or it may comprise a general purpose computing device selectively activated or reconfigured by a program stored in the device. Such a program may be stored on a storage medium, such as, but not limited to, any type of disk including floppy disks, optical disks, compact disc read only memories (CD-ROMs), magnetic-optical disks, read-only memories (ROMs), random access memories (RAMs), electrically programmable read-only memories (EPROMs), electrically erasable and programmable read only memories (EE-PROMs), magnetic or optical cards, or any other type of media suitable for storing electronic instructions, and capable of being coupled to a system bus for a computing device.

The processes and displays presented herein are not inherently related to any particular computing device or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the invention as described herein. In addition, it should be understood that operations, capabilities, and features described herein may be implemented with any combination of hardware (discrete or integrated circuits) and software.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may be used to indicate that two or more elements are in either direct or indirect (with other intervening elements between them) physical or electrical contact with each other, and/or that the two or more elements co-operate or interact with each other (e.Γ. as in a cause an effect relationship).

Embodiments of the present invention provide several feedback control system concepts for potential use in an adaptive impedance matching module (AIMM). These concepts may vary in RF system complexity, and hence cost. In an embodiment of the present invention, a basic technical objective is to minimize the magnitude of the input reflection coefficient seen at the $RF_{in}$ port under the boundary condition of a variable load impedance ZL.

Looking now at FIG. 1, generally as 100, is a first embodiment using simultaneous measurement of magnitude and phase for both forward and reflected waves using identical backward-wave couplers A 115 and B 110 which sample incident and reflected waves respectively at the input side of the tuner 120. Coupled and attenuated RF signals are fed into a single integrated circuit (IC) which may contain dual channel log amplifiers 127 and 129 followed by gain and phase detectors (such as built into the AD8302 as shown as 125). The dual outputs of the AD8302 125 generate a first voltage, $V_{MAG}$ 135 which is proportional to the ratio in dB of the input powers (forward and reversed), and a second voltage, VPHS 140, which is proportional to the phase difference between the two input signals. These two voltages may be digitally sampled in a closed loop control system.

The reference plane 145 for the measurement can be approximated as midway between the two directional couplers 110 and 115, which should be located as close together as possible. The finite directivity D of the couplers 110 and 115 sets the minimum detectable reflection coefficient The two RF paths between the couplers 110 and 115 and the AD8302 125 should be as well matched as possible since any differences create measurement errors. Also, the frequency response of the couplers 110 and 115 should be as close as possible or the differences should be compensated in software.

The phase detector inside the AD8302 125 can uniquely distinguish instantaneous phase over a range of only 180°. Thus, the phase is identified to within a plus or minus sign. So either Γ or its complex conjugate is known. The tuning algorithm will have to account for this degree of uncertainty.

In an embodiment of the present invention, a microcontroller or DSP chip 105 may sample the complex reflection coefficient information from ADC1 150 and ADC2 155. Since the reflection coefficient phase angle is known, a look-up table may be used to immediately perform a coarse tune function that feeds approximate bias voltages to the three DACs 160, 165 and 170 that in turn control high voltage buffers driving the PTCs 175, 180, 185. PTCs are a type of variable reactance network denoted a Parascan Tunable Capacitors, and they implement a variable capacitor function. If the magnitude of the reflection coefficient is not below a desired level, then fine tuning may be accomplished using small and iterative adjustments in bias voltage. Fine tuning may be necessary to compensate for variations in manufacturing tolerances of tuner component values, or to compensate for temperature variations of the PTCs under high power.

In the exemplary embodiments, three PTCs with independent control voltages are used in the tuner. However, it is understood that in general, any finite number of variable reactance networks with independent bias voltages or bias currents could be included. Also, the exemplary embodiments herein, a ladder network with series inductors and shunt caps is described. However, other tuner circuit topologies may also be used, and are thus intended to be within the scope of the present invention.

Figure 2:
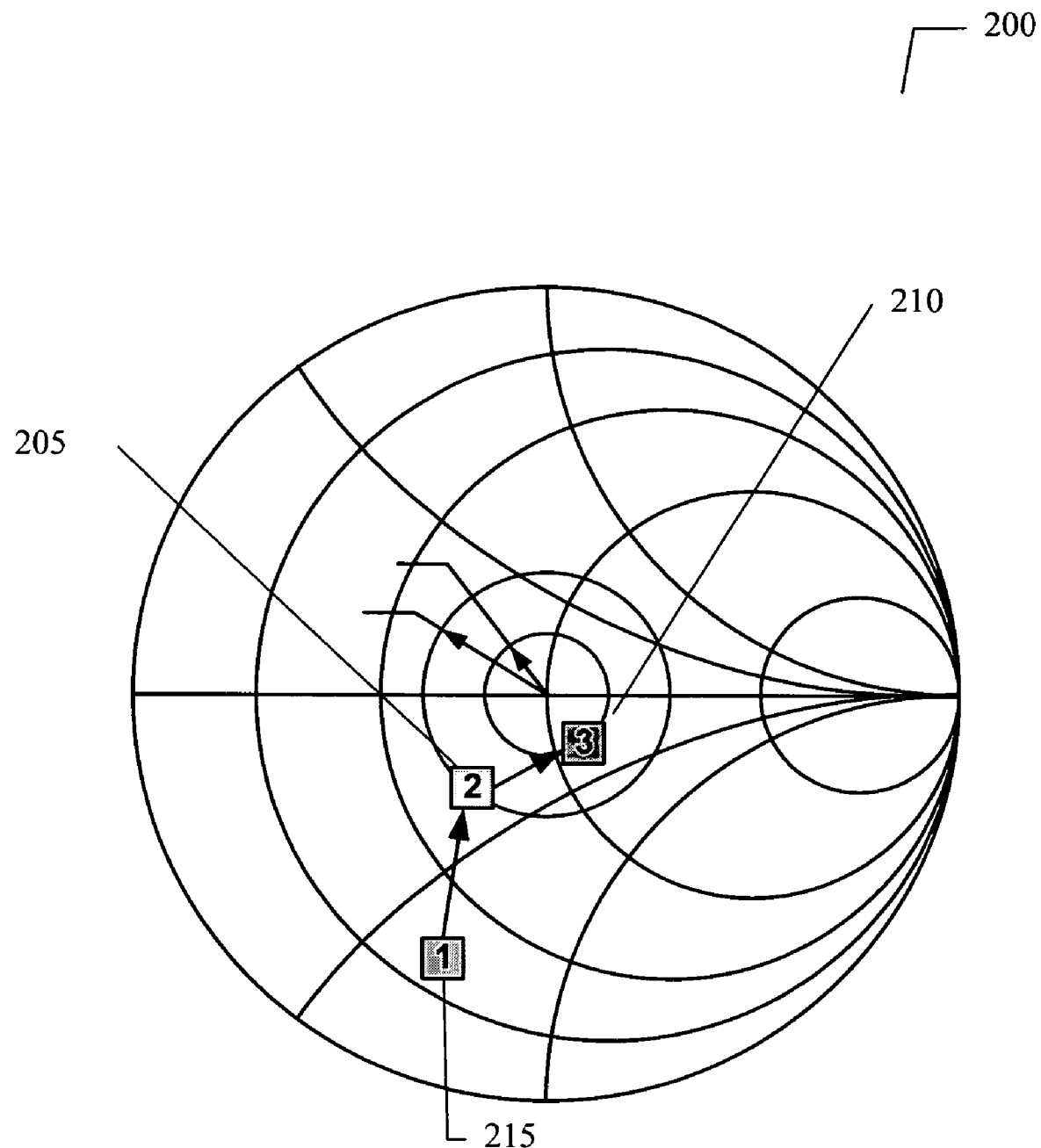
FIG. 2 is a Smith Chart showing the course to fine tuning of an embodiment of the present invention.

As an example to help understand the tuning process, consider the Smith Chart shown in FIG. 2 at 200. Assume the initial input reflection coefficient at a desired frequency is shown at 215 in this example. Coarse tuning moves the reflection coefficient Γ from point 1 215 to point 2 205 where the magnitude is now $|\Gamma_2|$. Application of a fine tuning algorithm moves the reflection coefficient from point 2 205 to point 3 210 where the magnitude is $|\Gamma_3|$. Repeated application of the fine tuning algorithm decreases $|\Gamma|$ further until a specified tolerance is achieved.

The fine tuning algorithm may be a scalar multi-variable minimization algorithm where the independent variables are the set of tuning voltages and the scalar cost function may be the magnitude of the reflection coefficient in dB. Many choices exist for this minimization algorithm including, but not limited to:

1. Downhill simplex method in multidimensions (section 10.4 of Numerical Recipes);
2. Conjugate gradient method in multidimensions (section 10.6 of Numerical Recipes);
3. Quasi-Newton method (section 10.7 of Numerical Recipes).

The digital processor drives digital-to-analog converters (DACs) whose output voltage is scaled with high voltage buffers to yield PTC bias voltages of zero to about 30 volts. A charge pump 190 may be used to multiply a typically available supply voltage of 3.3 volts to more than 30 volts to power the voltage buffers, although the present invention is not limited in this respect.

The charge pump 335 may be generalized to include any DC-to-DC converter capable of converting the available supply voltage to a desired higher or lower voltage, and this desired voltage may be positive or negative polarity, or dual positive and negative polarity. Furthermore, the 30 volt maximum PTC voltage used in the above example may be higher or lower depending on the design of the variable capacitors.

Figure 3:
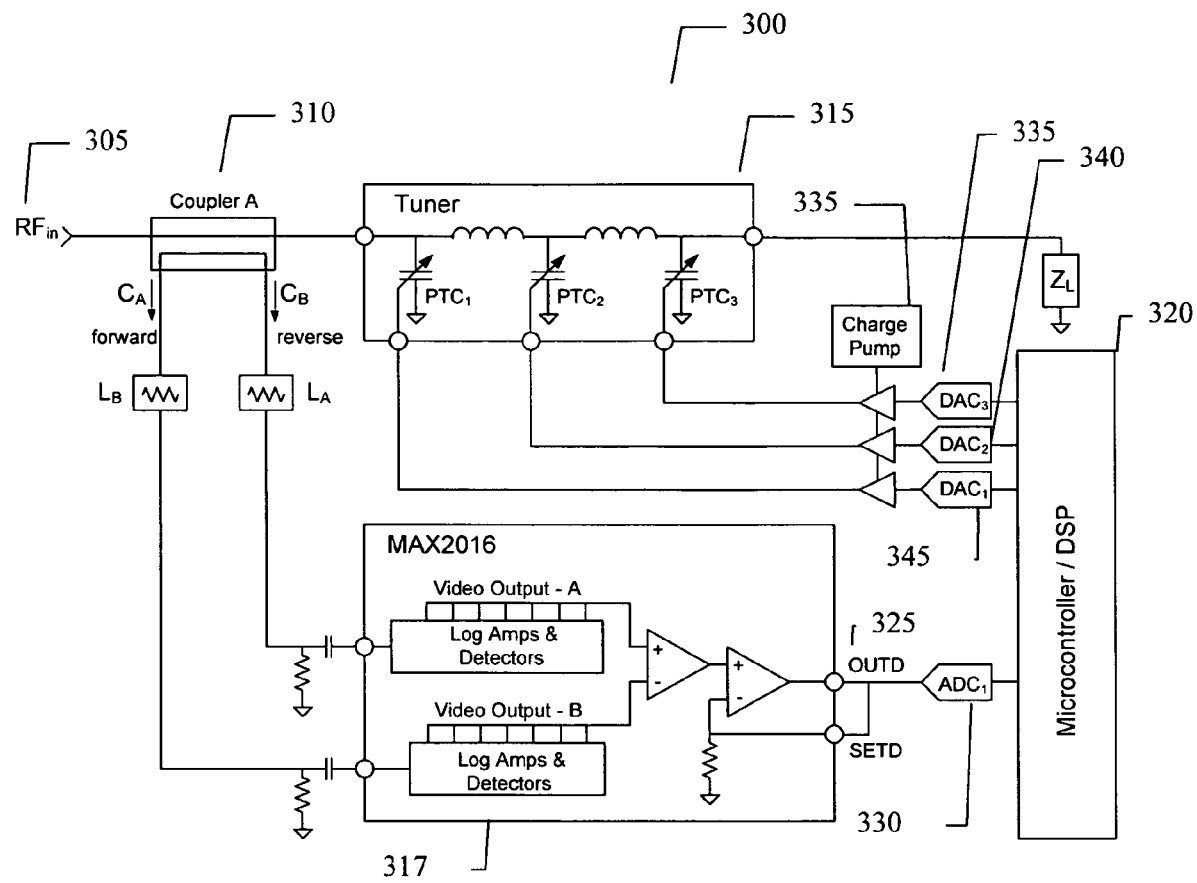
FIG. 3 is a schematic diagram showing simultaneous measurement of magnitude and phase for both forward and reflected waves of one embodiment of the present invention.

The voltage buffers in FIGS. 1 and 3 located between the DACs and PTCs may be replaced with transconductance amplifiers if the PTCs are replaced with variable reactance networks requiring a bias current rather than a bias voltage.

Depending on the processor implementation, the ADCs 150 and 155 and DACs 160, 165 and 170 may be integrated into the processor IC 125. The merits of this first embodiment of the present invention include that the digital control system can react very quickly to changes in load impedance since coarse tuning can be achieved with only one RF measurement. This is possible since both magnitude and phase of the reflection coefficient are simultaneously available.

A second embodiment of the present invention is illustrated in FIG. 3 at 300 and provides the simultaneous measurement of magnitude for both forward and reflected waves. In an embodiment of the present invention, a single backward-wave coupler 310 may sample incident and reflected power at the input side of the tuner 315. Coupled and attenuated RF signals 305 may be fed into a detector, such as a MAX2016 Dual Logarithmic Detector 317. The video output voltages (in dB) may be subtracted internally to create a difference signal at the output OUTD 325 which is proportional to the return loss in dB. Measured return loss is given by the simple formula $$RL(dB) = \frac{(V_{OUTD} - V_{CENTER})}{Slope}$$

where $V_{CENTER}$ is the output voltage under the condition of equal voltages at each input channel. The Slope is about 25 mV/dB. This return loss may then be digitally sampled in a closed loop control system. As with embodiment 1, the finite directivity D of the coupler sets the minimum detectable reflection coefficient.

A microcontroller or DSP chip 320 samples the return loss information using ADC1 330. Since the reflection coefficient phase angle is unknown, an iterative tuning algorithm may be required to minimize return loss. The tuning algorithm may be a scalar multi-variable minimization routine where the independent variables are the set of tuning voltages and the scalar cost function is the magnitude of the reflection coefficient in dB. Many choices exist for this minimization algorithm including:

1. Downhill simplex method in multidimensions (section 10.4 of Numerical Recipes)
2. Conjugate gradient method in multidimensions (section 10.6 of Numerical Recipes)
3. Quasi-Newton method (section 10.7 of Numerical Recipes)

The digital processor drives digital-to-analog converters (DACs) 335, 340 and 345 whose output voltage is scaled with high voltage buffers to yield PTC bias voltages of zero to about 30 volts. A charge pump 350 may be used to multiply a typically available supply voltage of 3.3 volts to more than 30 volts to power the voltage buffers.

Depending on the processor implementation, the ADC 330 and DACs 335, 340 and 345 may be integrated into the processor IC 317. The merit of this second embodiment is that return loss can be immediately measured in one digital sample.

Figure 4:
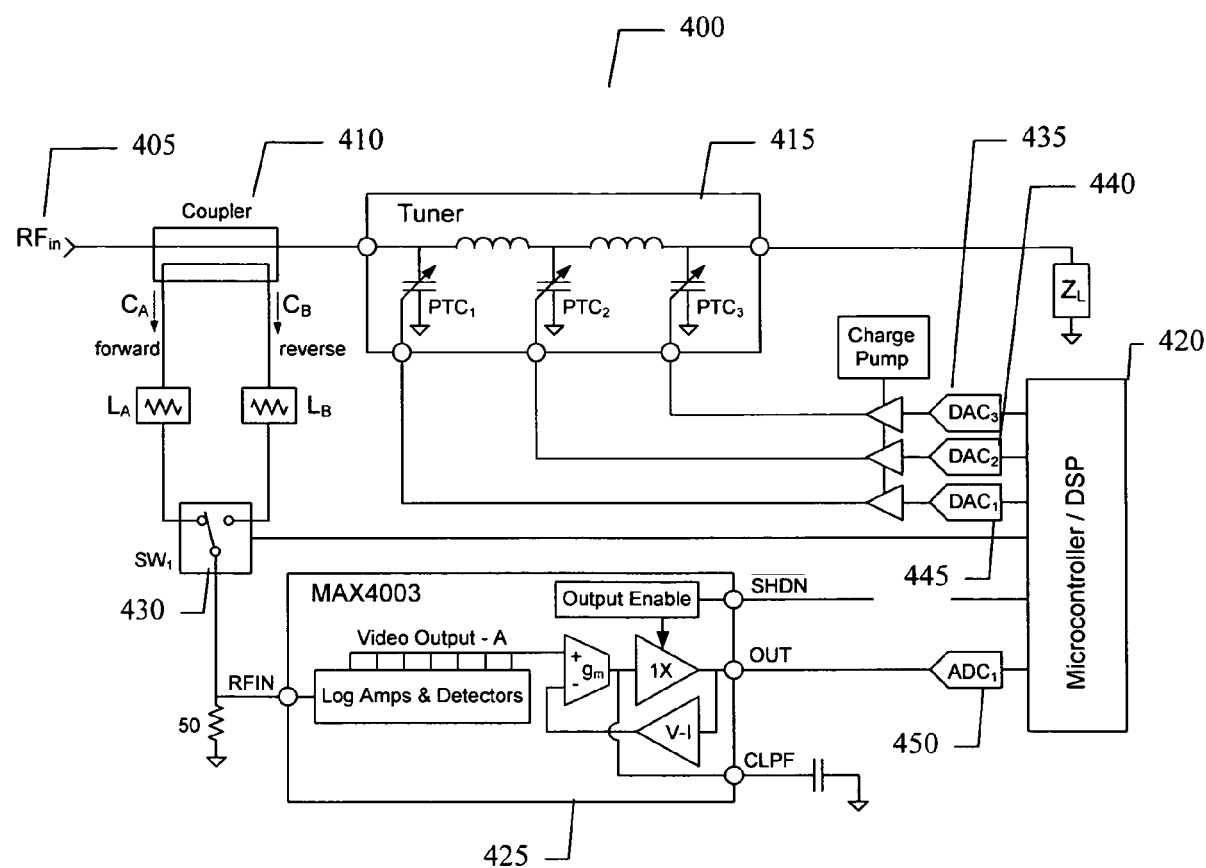
FIG. 4 is a schematic diagram showing sequential measurement of magnitude for both forward and reflected waves of one embodiment of the present invention.

Turning now to FIG. 4, is a third embodiment of the present invention and provides sequential measurement of magnitude for both forward and reflected waves. In this third embodiment of the present invention, a closed loop control system is built around a low cost MAX4003 log amplifier 425, although the present invention is not limited to any specific amplifier. A single backward-wave coupler 410 samples incident and reflected power at the input side of the tuner 415. The incident and reflected power levels are switched at $SW_1$ 430 such that they may be measured in sequence, as controlled by the processor. The MAX4003 426 output voltage, which is proportional to coupled power in dB, may be digitized and the return loss may then be calculated by the processor using sequential measurements. As with previous embodiments 1 and 2, the finite directivity D of the coupler sets the minimum detectable return loss.

The MAX4003 425 log amp was selected because it has a shutdown mode where it drawns only 13 uA of current. Furthermore, when powered, it consumes only 6 mA from a 3.0 volt supply (18 mW). Again, the present invention is not limited to using any particular log amp.

Since the microcontroller or DSP chip 420 computes only the return loss (no phase information is available), then an iterative tuning algorithm is required to minimize return loss. The tuning algorithm is a scalar multi-variable minimization routine where the independent variables are the set of tuning voltages and the scalar cost function is the magnitude of the reflection coefficient in dB. Many choices exist for this minimization algorithm including:

1. Downhill simplex method in multidimensions;
2. Conjugate gradient method in multidimensions; and
3. Quasi-Newton method.

As with the previous embodiments, the digital processor drives digital-to-analog converters (DACs) 435, 440 and 445 whose output voltage is scaled with high voltage buffers to yield PTC bias voltages of zero to about 30 volts. Depending on the processor implementation, the ADC 450 and DACs 435, 440 and 445 may be integrated into the processor IC.

The merits of the present third embodiment include, but are not limited to:

A relatively low cost log amp is employed. The MAX4003 sells for ~$1.09 in qty of 100.

The MAX4003 log amp consumes only 18 mW of power during normal operation at 3.0 volts.

The log amp can be powered down when power measurements are not required.

Figure 5:
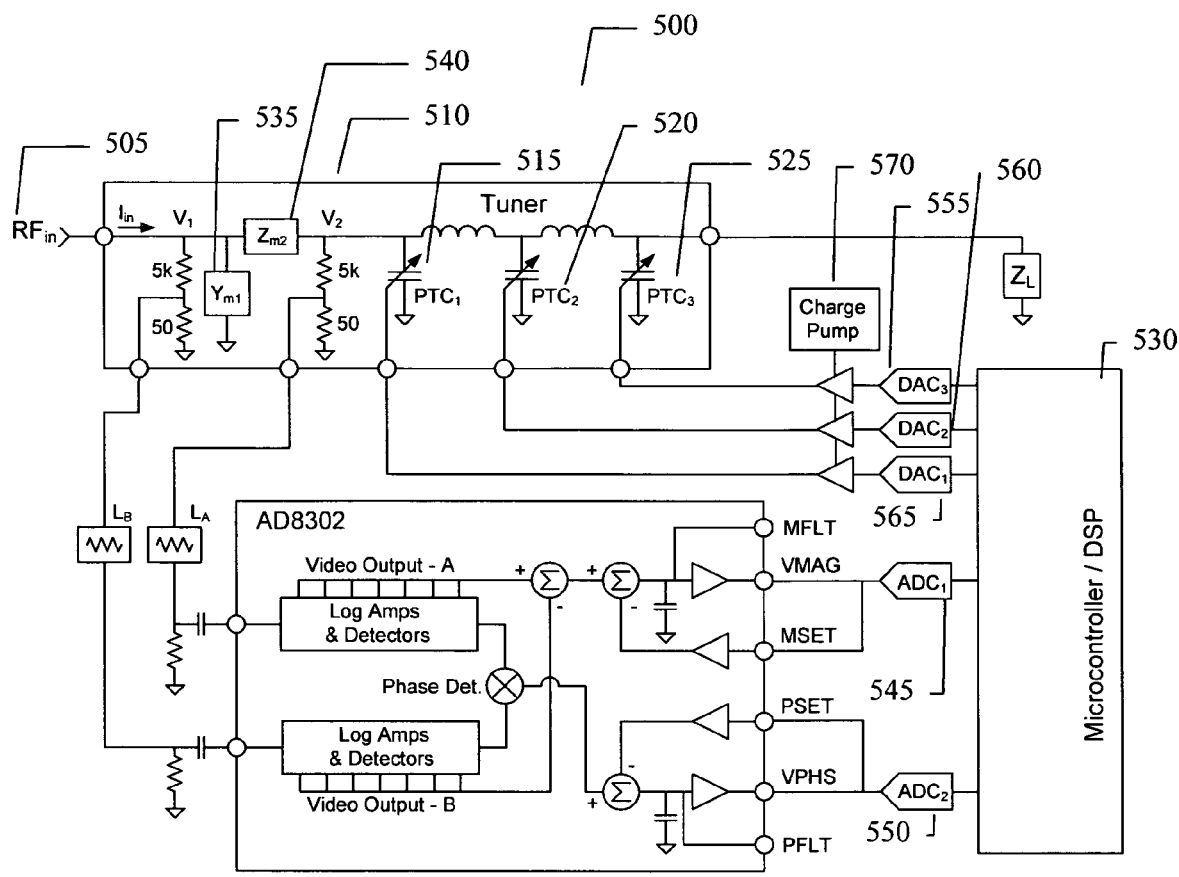
FIG. 5 is a schematic diagram showing direct measurement of the ratio of the first two nodal voltages of one embodiment of the present invention.

Turning now to FIG. 5, is a fourth embodiment of the present invention and provides direct measurement of the ratio of the first two nodal voltages. This embodiment is designed to offer an "indirect" measurement of input impedance or input reflection coefficient for the tuner 510. In contrast, a direct measurement would involve directional couplers as in embodiments 1, 2, and 3. By eliminating the directional couplers one saves BOM cost and board real estate and eliminates a bandwidth restriction caused by miniature narrowband couplers.

The input impedance sensing circuit consists of two additional known reactive components on the input side of the tuner, namely $Y_{m1}$ 535 and $Z_{m2}=1/Y_{m2}$ 540. RF voltages V1 and V2 are measured using high impedance (relative to Zo=50 W) resistive voltage dividers. The input impedance may be expressed as $$Z_{in} = \frac{V_1}{I_{in}} = \frac{V_1}{V_1 Y_{m1} + \left(\frac{V_1 - V_2}{Z_{m2}}\right)} = \frac{1}{Y_{m1} + \left(\frac{1 - V_2/V_1}{Z_{m2}}\right)} = \frac{1}{Y_{in}}.$$

Since the input reflection coefficient $\Gamma$ can be expressed in terms of input admittance, then $$\Gamma = \frac{Y_o - Y_{in}}{Y_o + Y_{in}}$$
$$= \frac{Y_o - Y_{m1} - \left(\frac{1 - V_2/V_1}{Z_{m2}}\right)}{Y_o + Y_{m1} + \left(\frac{1 - V_2/V_1}{Z_{m2}}\right)}$$
$$= \frac{Y_o - Y_{m1} - Y_{m2}(1 - V_2/V_1)}{Y_o + Y_{m1} + Y_{m2}(1 - V_2/V_1)}.$$

Hence the complex value of $\Gamma$ is known with one digital sample of the complex ratio of nodal voltages. It should be noted that components $Y_{m1}$ 535 and $Z_{m2}$ 540 are not restricted, but they must be known. Their values are chosen by the system designer, and $Y_{m1}$ 535 may be set to zero (omitted) if desired. Only a series component is required for this approach to work. The accuracy of the indirectly measured $\Gamma$ is defined largely by the component tolerances of $Y_{m1}$ 535 and $Z_{m2}$ 540.

One could design the tuner such that $Y_{m1}$ 535 is the first shunt voltage tunable capacitor (PTC) and $Z_{m2}$ 540 is the first series inductor, or a short series transmission line. However, this would require that the PTC capacitance be known very accurately for all bias voltages and temperatures. While it is conceivable to obtain such detailed information, it may not be practical in high volume production depending on the tolerance required.

A microcontroller or DSP chip 530 samples the complex node voltage ratio from ADC1 545 and ADC2 550 and calculates the complex input reflection coefficient directly from the equation above. A look-up table may be used to immediately perform a coarse tune function that feeds approximate bias voltages to the three DACs 555, 560 and 565 that in turn control high voltage buffers for the PTCs 515, 520, 525. If the magnitude of the reflection coefficient is not below a desired level, then fine tuning can be accomplished using small and iterative adjustments in bias voltage. Fine tuning may be necessary to compensate for variations in manufacturing tolerances of tuner component values, or to compensate for temperature variations of the PTCs under high power.

The fine tuning algorithm may be a scalar multi-variable minimization algorithm where the independent variables are the set of tuning voltages and the scalar cost function may be the magnitude of the reflection coefficient in dB. Many choices exist for this minimization algorithm including
1. Downhill simplex method in multidimensions;
2. Conjugate gradient method in multidimensions; and
3. Quasi-Newton method.

The digital processor 530 drives digital-to-analog converters (DACs) 555, 560 and 565 whose output voltage is scaled with high voltage buffers to yield PTC bias voltages of zero to about 30 volts. A charge pump 570 may be used to multiply a typically available supply voltage of 3.3 volts to more than 30 volts to power the voltage buffers. Depending on the processor implementation, the ADCs 545 and 550 and DACs 555, 560 and 565 may be integrated into the processor IC.

The merits of the present embodiment shown in FIG. 5 include:
Board real estate may be reduced significantly because directional couplers are not needed, and the resistive dividers occupy a very small footprint.
The cost of directional couplers is eliminated.
The bandwidth of the reflection coefficient sensing circuit is significantly increased relative to using miniature ceramic hybrid couplers.
The digital control system can react very quickly to changes in load impedance since course tuning can be achieved with only one RF measurement. This is possible since both magnitude and phase of the first two nodal voltages are simultaneously available.

Figure 6:
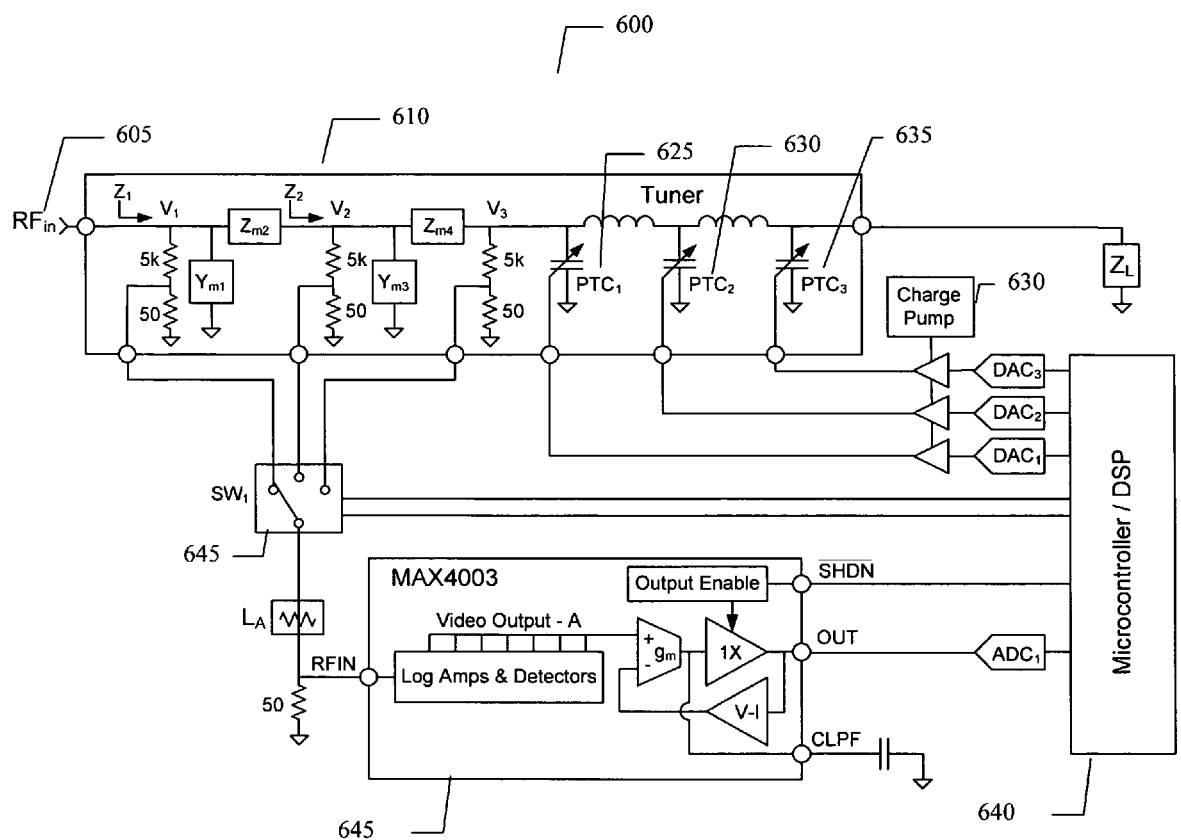
FIG. 6 is a schematic diagram showing direct measurement of three nodal voltages of one embodiment of the present invention.

Turning now to FIG. 6, is a fifth embodiment of the present invention and provides direct measurement of the ratio of the first two nodal voltages. In this embodiment is a modification of embodiment 4 where three node voltages are measured instead of two, and only their magnitudes are measured using a single channel log amp or temperature compensated diode detector. Ratios of node voltages are calculated by the microcontroller/DSP 640. Any ambiguity of V1 and V2 used to calculate Z1 based on magnitude measurements may be resolved by calculating Z2 from a measurement of a second pair of voltages, V2 and V3. Then Z2 is mapped into Z1 given the known values of shunt and series measurement impedances. In this manner, three measurements of node voltage magnitude permit a unique determination of the input impedance Z1 for the tuner.

Embodiments 1-3 described above may use directional couplers to measure forward and reflected power. So for these embodiments, the minimum dynamic range needed by the detector is the magnitude of the best case return loss that is desired to be resolved, plus the dynamic range of the input RF signal. So if it is desired to resolve a return loss down to −20 dB and operate the AIMM over a 30 dB dynamic range of input powers, then a 50 dB (20 dB+30 dB) log amplifier may be needed. In contrast, embodiments 4 and 5 measure the total RF voltage at the nodes. These voltages are expected to be fairly similar in magnitude, especially for a well matched tuner. So the detector's required dynamic range is expected to be less for embodiments 4 and 5.

Current consumption will also be less for the MAX2205-2208 family of detectors relative to a log amp. They typically consume only 3.5 mA or less at 3 volts, and 0.5 uA at shutdown. The ability to create a successful AIMM depends on two critical technical achievements. The first requirement is to create a highly-linear, series network of low loss, tunable capacitors. But the second requirement is for a monolithic, low cost, logarithmic amplifier with a broad dynamic range. Dynamic range is very important for many cell phone applications where transmit power control over multiple decades is required, although the present invention is not limited in this respect.

The advent of a log amp with an integrated phase detector provides a dramatic advantage in closed loop settling time compared to conventional log amps with only envelope detection. The reason for the advantage is that phase and magnitude information are used together to achieve coarse tuning with only one sample of reflection coefficient or node voltage. The only commercially available log amp with a phase detector is Analog Devices part number AD8302. However, the cost of the AD8302 is expected to be an order of magnitude higher than a conventional single channel log amp. One of the major drawbacks of the AD8302 is its relatively high current consumption at 20 mA and a shutdown feature is needed on a future version of this part. As with FIG. 5, switch SW1 is shown at 645 and Tuner 610 may include voltage tunable capacitors, such as voltage tunable dielectric varactors, which may be referred to as Parascan® Tunable Capacitors (PTCs). Charge pump 630 may also be included such as with the charge pump of FIG. 5.

In some embodiments of the present invention described above, the impedances added to the tuner for measurements of Γ in embodiment 4 may be any reactance. However, an obvious option is to use a shunt capacitor followed by a series inductor. This will preserve the ladder circuit topology that was employed in each of the previous embodiments.

Figure 7:
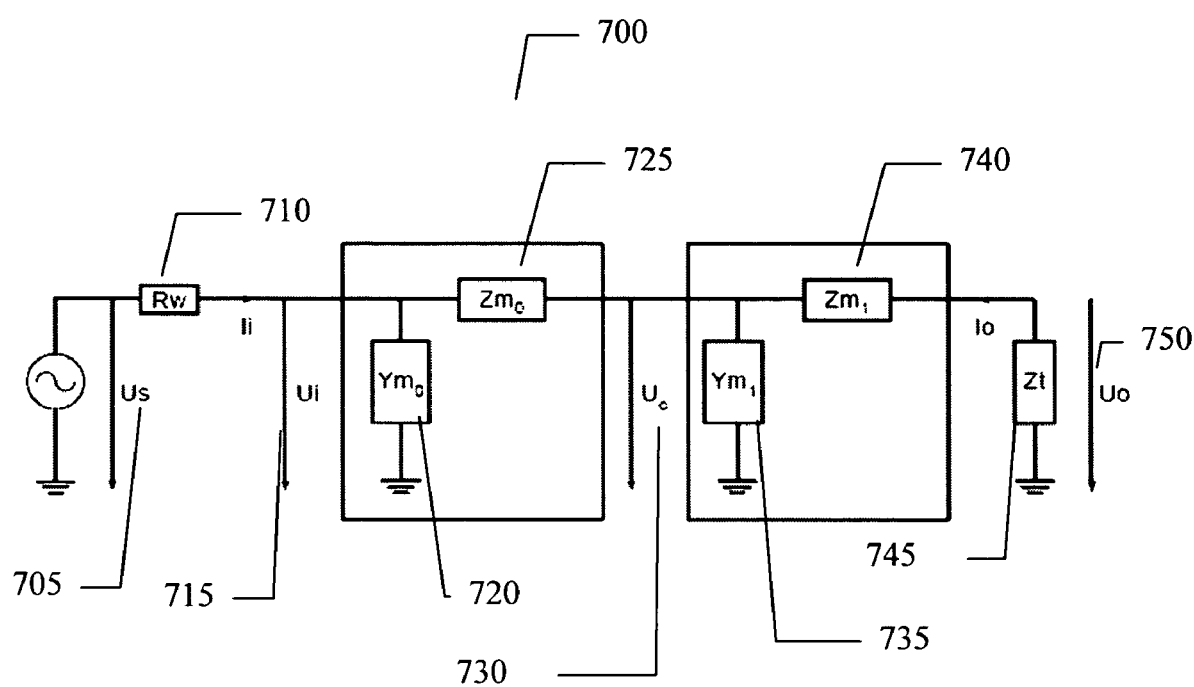
FIG. 7 illustrates an apparatus that may use a method to compute the terminating impedance of a cascade of 2-port devices of an embodiment of the present invention.

Looking now at FIG. 7 is an embodiment of the present invention that illustrates a method to compute the terminating impedance of a cascade of 2-port devices 700 which are characterized through transmission (or ABCD) parameters and to which a signal from a source with a known impedance is applied by measuring the magnitude of the voltages at the input and output of the cascade and between the devices. Depicted in FIG. 7 is:

source voltage $U_s$ 705; reference impedance $R_w$ 710; network elements $Z_m$ 725 and 740 and $Y_m$ 720 and 735; terminating impedance $Z_t$ 745; input voltage $U_i$ 715; voltage $U_c$ 730; and output voltage $U_o$ 750,

| Indices | $i := 0 \; c := 1 \; o := 2$ |
|---|---|
| Source Voltage | $U_s := 2 \text{ V}$ |
| Reference Impedance | $R_w := 50 \, \Omega$ |
| Network Elements | $Z_m := (1 + 4.5j \; 1 - 8j)^T$; |
|  | $Y_m := (0.2 - 0.4j \; 0.075 - 0.264j)^T 1\text{ho}$ |
| Terminating Impedance | $Z_t := 20 - 75j \, \Omega$ |

Given this information we can compute the input voltage $U_i$ as $$U_i := \cfrac{1}{1 + \left(Y m_0 + \cfrac{1}{Z m_0 + \cfrac{1}{Y m_1 + \cfrac{1}{Z m_1 + Z t}}}\right) \cdot R w} \cdot U_s \quad |U_i| = 0.069824$$

the voltage $U_c$ as $$U_c := \cfrac{\cfrac{1}{Y m_1 + \cfrac{1}{Z m_1 + Z t}}}{Z m_0 + \cfrac{1}{Y m_1 + \cfrac{1}{Z m_1 + Z t}}} \cdot U_i \quad |U_c| = 0.031494$$

and the output voltage $U_o$ as $$U_o := \frac{Z t}{Z m_1 + Z t} \cdot U_c \quad |U_o| = 0.028553$$

Transmission parameters $$A1 := \begin{pmatrix} \frac{1}{Zm_0} & 1 \\ \frac{Ym_0}{Zm_0} & Ym_0 + \frac{1}{Zm_0} \end{pmatrix} \cdot Zm_0 \qquad A1 = \begin{pmatrix} 1 & 1+4.5j \\ 0.2-0.4j & 3+0.5j \end{pmatrix}$$

$$A2 := \begin{pmatrix} \frac{1}{Zm_1} & 1 \\ \frac{Ym_1}{Zm_1} & Ym_1 + \frac{1}{Zm_1} \end{pmatrix} \cdot Zm_1 \quad A2 = \begin{pmatrix} 1 & 1-8j \\ 0.075-0.264j & -1.037-0.864j \end{pmatrix}$$

$$Ac := A1 \cdot A2 \qquad Ac = \begin{pmatrix} 2.263+0.073j & 3.851-13.531j \\ 0.557-1.155j & -5.679-5.111j \end{pmatrix}$$

$$U_i = \frac{Z_i}{Rw + Z_i} \cdot Us = \frac{(Ac_{0,0} \cdot Zt + Ac_{0,1}) \cdot Us}{(Ac_{1,0} \cdot Zt + Ac_{1,1}) \cdot Rw + Ac_{0,0} \cdot Zt + Ac_{0,1}} \quad (1)$$

$$U_o = \frac{Zt \cdot U_i}{Ac_{0,0} \cdot Zt + Ac_{0,1}} = \frac{Zt \cdot Us}{(Ac_{1,0} \cdot Zt + Ac_{1,1}) \cdot Rw + Ac_{0,0} \cdot Zt + Ac_{0,1}} \quad (2)$$

$$U_c = \frac{(A2_{0,0} Zt + A2_{0,1}) \cdot Us}{(Ac_{1,0} \cdot Zt + Ac_{1,1}) \cdot Rw + Ac_{0,0} \cdot Zt + Ac_{0,1}} \quad (3)$$

We divide the transmission parameters and the termination into real and imaginary components $$
\begin{array}{ll}
Ar1 := \mathrm{Re}(A1) & Ai1 := \mathrm{Im}(A1) \\
Ar2 := \mathrm{Re}(A2) & Ai2 := \mathrm{Im}(A2) \\
Arc := \mathrm{Re}(Ac) & Aic := \mathrm{Im}(Ac) \\
Xt := \mathrm{Re}(Zt) & Yt := \mathrm{Im}(Zt)
\end{array} \tag{5}
$$

and express the magnitudes of the measured voltages as $$(|U_i|)^2 = \frac{\left[\begin{array}{l}(Arc_{0,0} \cdot Xt - Aic_{0,0} \cdot Yt + Arc_{0,1})^2 + \\ (Aic_{0,0} \cdot Xt - Arc_{0,0} \cdot Yt + Aic_{0,1})^2\end{array}\right] \cdot Us^2}{\left[\begin{array}{l}(Arc_{1,0} \cdot Rw + Arc_{0,0}) \cdot \\ Xt - (Aic_{1,0} \cdot Rw + Aic_{0,0}) \cdot \\ Yt + Arc_{1,1} \cdot Rw + Arc_{0,1}\end{array}\right]^2 \cdots + \left[\begin{array}{l}(Aic_{1,0} \cdot Rw + Aic_{0,0}) \cdot Xt - \\ (Arc_{1,0} \cdot Rw + Arc_{0,0}) \cdot Yt + \\ Aic_{1,1} \cdot Rw + Aic_{0,1}\end{array}\right]^2} \tag{4}$$

$$(|U_c|)^2 = \frac{\left[\begin{array}{l}(Ar2_{0,0} \cdot Xt - Ai2_{0,0} \cdot Yt + Ar2_{0,1})^2 + \\ (Ai2_{0,0} \cdot Xt - Ar2_{0,0} \cdot Yt + Ai2_{0,1})^2\end{array}\right] \cdot Us^2}{\left[\begin{array}{l}(Arc_{1,0} \cdot Rw + Arc_{0,0}) \cdot \\ Xt - (Aic_{1,0} \cdot Rw + Aic_{0,0}) \cdot \\ Yt + Arc_{1,1} \cdot Rw + Arc_{0,1}\end{array}\right]^2 \cdots + \left[\begin{array}{l}(Aic_{1,0} \cdot Rw + Aic_{0,0}) \cdot Xt + \\ (Arc_{1,0} \cdot Rw + Arc_{0,0}) \cdot Yt + \\ Aic_{1,1} \cdot Rw + Aic_{0,1}\end{array}\right]^2} \tag{5}$$

$$(|U_o|)^2 = \frac{(Xt^2 + Yt^2) \cdot Us^2}{\left[\begin{array}{l}(Arc_{1,0} \cdot Rw + Arc_{0,0}) \cdot \\ Xt - (Aic_{1,0} \cdot Rw + Aic_{0,0}) \cdot \\ Yt + Arc_{1,1} \cdot Rw + Arc_{0,1}\end{array}\right]^2 \cdots + \left[\begin{array}{l}(Aic_{1,0} \cdot Rw + Aic_{0,0}) \cdot Xt + \\ (Arc_{1,0} \cdot Rw + Arc_{0,0}) \cdot Yt + \\ Aic_{1,1} \cdot Rw + Aic_{0,1}\end{array}\right]^2} \tag{6}$$

We solve (6) for $Us^2$ $$Us^2 = \frac{\left[\left[\begin{array}{l}(Arc_{1,0} \cdot Rw + Arc_{0,0}) \cdot \\ Xt - (Aic_{1,0} \cdot Rw + Aic_{0,0}) \cdot \\ Yt + Arc_{1,1} \cdot Rw + Arc_{0,1}\end{array}\right]^2 \cdots + \left[\begin{array}{l}(Aic_{1,0} \cdot Rw + Aic_{0,0}) \cdot \\ Xt - (Arc_{1,0} \cdot Rw + Arc_{0,0}) \cdot \\ Yt + Aic_{1,1} \cdot Rw + Aic_{0,1}\end{array}\right]^2\right] \cdot (|U_o|)^2}{(Xt^2 + Yt^2)} \tag{6a}$$

and substitute (6a) in (4) and (5)

$$(|U_i|)^2 = \frac{\left[\begin{array}{l}(Arc_{0,0} \cdot Xt - Aic_{0,0} \cdot Yt + Arc_{0,1})^2 + \\ (Aic_{0,0} \cdot Xt - Arc_{0,0} \cdot Yt + Aic_{0,1})^2\end{array}\right] \cdot (|U_o|)^2}{Xt^2 + Yt^2} \tag{7}$$

$$(|U_c|)^2 = \frac{\left[\begin{array}{l}(Ar2_{0,0} \cdot Xt - Ai2_{0,0} \cdot Yt + Ar2_{0,1})^2 + \\ (Ai2_{0,0} \cdot Xt - Ar2_{0,0} \cdot Yt + Ai2_{0,1})^2\end{array}\right] \cdot (|U_o|)^2}{Xt^2 + Yt^2} \tag{8}$$

(7) and (8) can be written in the form $$\left[Xt - \frac{\mathrm{Re}(Ac_{0,0} \cdot \overline{Ac_{0,1}})}{\left(\frac{|U_i|}{|U_o|}\right)^2 - (|Ac_{0,0}|)^2}\right]^2 + \left[Yt - \frac{\mathrm{Im}(Ac_{0,0} \cdot \overline{Ac_{0,1}})}{\left(\frac{|U_i|}{|U_o|}\right)^2 - (|Ac_{0,0}|)^2}\right]^2 = \tag{9}$$

$$\left[\frac{|Ac_{0,1}| \cdot \frac{|U_i|}{|U_o|}}{\left(\frac{|U_i|}{|U_o|}\right)^2 - (|Ac_{0,0}|)^2}\right]^2$$

$$\left[Xt - \frac{\mathrm{Re}(A2_{0,0} \cdot \overline{A2_{0,1}})}{\left(\frac{|U_c|}{|U_o|}\right)^2 - (|A2_{0,0}|)^2}\right]^2 + \left[Yt - \frac{\mathrm{Im}(A2_{0,0} \cdot \overline{A2_{0,1}})}{\left(\frac{|U_c|}{|U_o|}\right)^2 - (|A2_{0,0}|)^2}\right]^2 = \tag{10}$$

$$\left[\frac{|A2_{0,1}| \cdot \frac{|U_c|}{|U_o|}}{\left(\frac{|U_c|}{|U_o|}\right)^2 - (|A2_{0,0}|)^2}\right]^2$$

We also solve (4) for $Us^2$ and substitute in (5), resulting in $$(|U_c|)^2 = \frac{\left[\begin{array}{l}(Ar2_{0,0} \cdot Xt - Ai2_{0,0} \cdot Yt + Ar2_{0,1})^2 + \\ (Ai2_{0,0} \cdot Xt + Ar2_{0,0} \cdot Yt + Ai2_{0,1})^2\end{array}\right]}{(Arc_{0,0} \cdot Xt - Aic_{0,0} \cdot Yt + Arc_{0,1})^2 + (Aic_{0,0} \cdot Xt - Arc_{0,0} \cdot Yt + Aic_{0,1})^2} \cdot (|U_i|)^2 \tag{11}$$

from which we derive $$\left[Xt + \frac{\text{Re}(Ac_{0,0} \cdot \overline{Ac_{0,1}}) \cdot \left(\frac{|U_c|}{|U_i|}\right)^2 + -\text{Re}(A2_{0,0} \cdot \overline{A2_{0,1}})}{(|Ac_{0,0}|)^2 \cdot \left(\frac{|U_c|}{|U_i|}\right)^2 - (|Ac_{0,0}|)^2}\right]^2 \ldots = \quad (12)$$

$$\frac{\left[\begin{array}{c}(|Ac_{0,0}| \cdot |A2_{0,1}|)^2 \ldots + \\ (|Ac_{0,1}| \cdot |A2_{0,0}|)^2 \ldots + \\ -2 \cdot \text{Re}(Ac_{0,0} \cdot \overline{Ac_{0,1}} \cdot \overline{A2_{0,0}} \cdot A2_{0,1})\end{array}\right] \cdot \left(\frac{|U_c|}{|U_i|}\right)^2}{\left[(|Ac_{0,0}|)^2 \cdot \left(\frac{|U_c|}{|U_i|}\right)^2 - (|A2_{0,0}|)^2\right]^2} +$$

$$\left[Yt - \frac{\text{Im}(Ac_{0,0} \cdot \overline{Ac_{0,1}}) \cdot \left(\frac{|U_c|}{|U_i|}\right)^2 \ldots +}{(|Ac_{0,0}|)^2 \cdot \left(\frac{|U_c|}{|U_i|}\right)^2 - (|A2_{0,0}|)^2}\right]^2$$

(9) (10) and (12) are in the form $(Xt-X)^2+(Yt-Y)^2=R^2$ and so constitute circles on the impedance plane The 2 circles must intersect in 2 points, one of which represents the terminating impedance. The following functions are useful to plot the impedance plane circles and to find the intersections of 2 circles.

Functions to plot circles $$yc(x, xo, yo, r) := \begin{bmatrix} yo + \sqrt{r^2 - (x - xo)^2} \\ yo - \sqrt{r^2 - (x - xo)^2} \end{bmatrix}$$

Find real components of intersections $xcint(x, y, r) :=$ $$\frac{\left[\begin{array}{c}[(x_1 - x_0)^2 + (y_1 - y_0)^2 + (r_0)^2 - (r_1)^2] \cdot (x_1 - x_0) \ldots + \\ (y_1 - y_0) \cdot \sqrt{(2 \cdot r_0 \cdot r_1)^2 - \left[\frac{(x_1 - x_0)^2 + (y_1 - y_0)^2 -}{(r_1)^2 - (r_0)^2}\right]^2} \\ [(x_1 - x_0)^2 + (y_1 - y_0)^2 + (r_0)^2 - (r_1)^2] \cdot (x_1 - x_0) \ldots + \\ -(y_1 - y_0) \cdot \sqrt{(2 \cdot r_0 \cdot r_1)^2 - \left[\frac{(x_1 - x_0)^2 + (y_1 - y_0)^2 -}{(r_1)^2 - (r_0)^2}\right]^2}\end{array}\right]}{2[(x_1 - x_0)^2 + (y_1 - y_0)^2]} + x_0$$

$$X_i := \frac{\text{Re}(Ac_{0,0} \cdot \overline{Ac_{0,1}})}{\left(\frac{|U_i|}{|U_o|}\right)^2 - (|Ac_{0,0}|)^2} \qquad X_c := \frac{\text{Re}(A2_{0,0} \cdot \overline{A2_{0,1}})}{\left(\frac{|U_c|}{|U_o|}\right)^2 - (|A2_{0,0}|)^2}$$

$$Y_i := \frac{\text{Im}(Ac_{0,0} \cdot \overline{Ac_{0,1}})}{\left(\frac{|U_i|}{|U_o|}\right)^2 - (|Ac_{0,0}|)^2} \qquad Y_c := \frac{\text{Im}(A2_{0,0} \cdot \overline{A2_{0,1}})}{\left(\frac{|U_c|}{|U_o|}\right)^2 - (|A2_{0,0}|)^2}$$

$$R_i := \left|\frac{|Ac_{0,1}| \cdot \frac{|U_i|}{|U_o|}}{\left(\frac{|U_i|}{|U_o|}\right)^2 - (|Ac_{0,0}|)^2}\right| \qquad R_c := \left|\frac{|A2_{0,1}| \cdot \frac{|U_c|}{|U_o|}}{\left(\frac{|U_c|}{|U_o|}\right)^2 - (|A2_{0,0}|)^2}\right|$$

$$X_o := \frac{\text{Re}(Ac_{0,0} \cdot \overline{Ac_{0,1}}) \cdot \left(\frac{|U_c|}{|U_i|}\right)^2 - \text{Re}(A2_{0,0} \cdot \overline{A2_{0,1}})}{(|Ac_{0,0}|)^2 \cdot \left(\frac{|U_c|}{|U_i|}\right)^2 - (|A2_{0,0}|)^2}$$

$$Y_o := \frac{\text{Im}(Ac_{0,0} \cdot \overline{Ac_{0,1}}) \cdot \left(\frac{|U_c|}{|U_i|}\right)^2 - \text{Im}(A2_{0,0} \cdot \overline{A2_{0,1}})}{(|Ac_{0,0}|)^2 \cdot \left(\frac{|U_c|}{|U_i|}\right)^2 - (|A2_{0,0}|)^2}$$

$$R_o := \left|\frac{\sqrt{(|Ac_{0,0}| \cdot |A2_{0,1}|)^2 + (|Ac_{0,1}| \cdot |A2_{0,0}|)^2 \ldots + \\ -2 \cdot \text{Re}(Ac_{0,0} \cdot \overline{Ac_{0,1}} \cdot \overline{A2_{0,0}} \cdot A2_{0,1})} \cdot \frac{|U_c|}{|U_i|}}{(|Ac_{0,0}|)^2 \cdot \left(\frac{|U_c|}{|U_i|}\right)^2 - (|A2_{0,0}|)^2}\right|$$

Find both intersections on Z-plane, representing 2 possible solutions $$CircInt(x, y, r) := \begin{vmatrix} \varepsilon \leftarrow \sqrt{r_0 \cdot r_1} \cdot 10^{-10} \\ C \leftarrow xcint(x, y, r) \\ \text{for } i \in 0 \ldots 1 \\ \quad \begin{vmatrix} \text{for } k \in 0 \ldots 1 \\ \quad Y^{(k)} \leftarrow yc(C_i \cdot x_k, y_k \cdot r_k) \\ m \leftarrow \begin{vmatrix} 0 & \text{if } (|Y_{0,0} - Y_{0,1}| < \varepsilon) + (|Y_{0,0} - Y_{1,1}| < \varepsilon) \\ 1 & \text{otherwise} \end{vmatrix} \\ CI_i \leftarrow C_i + j \cdot Y_{m,0} \end{vmatrix} \\ CI \end{vmatrix}$$

Figure 8:
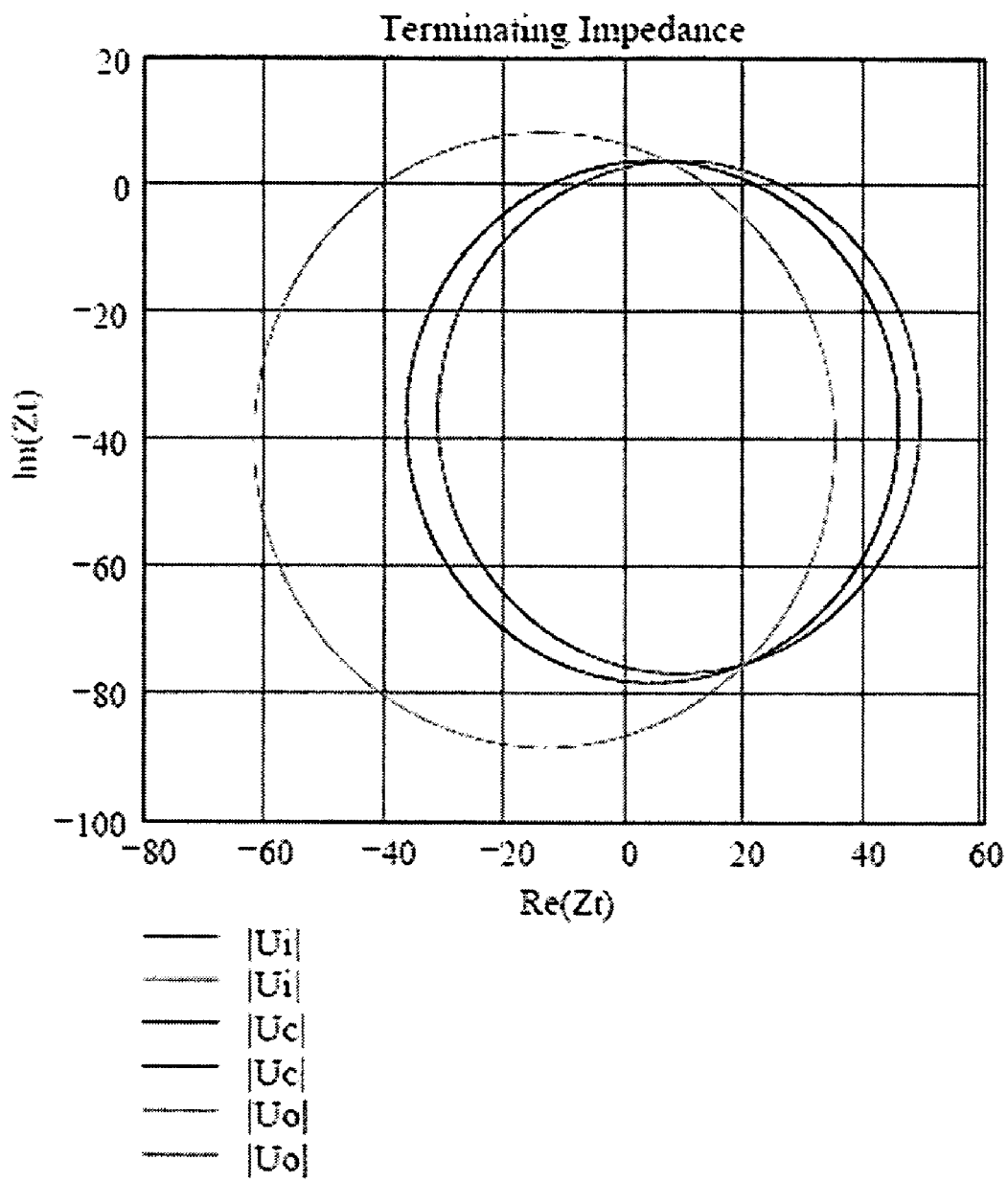
FIG. 8 plots impedance circles on an impedance plane an embodiment of the present invention.

Looking now at FIG. 8 at 800:
We plot the circles on the impedance plane
Plot formatting

| | | | |
|---|---|---|---|
| Number of samples | $Ns := 2001$ | | |
| $U_i$ circle | $Xmin_i := X_i - R_i \quad Xmax_i := X_i + R_i$<br>$xi := Xmin_i, Xmin_i + \Delta x_i \ldots Xmax_i$ | | $\Delta x_i := \dfrac{Xmax_i - Xmin_i}{1.01 \cdot (Ns - 1)}$ |
| $U_c$ circle | $Xmin_c := X_c - R_c \quad Xmax_c := X_c + R_c$<br>$xc := Xmin_c, Xmin_c + \Delta x_c \ldots Xmax_c$ | | $\Delta x_c := \dfrac{Xmax_c - Xmin_c}{Ns - 1}$ |
| $U_o$ circle | $Xmin_o := X_o - R_o \quad Xmax_o := X_o + R_o$<br>$xo := Xmin_o, Xmin_o + \Delta x_o \ldots Xmax_o$ | | $\Delta x_o := \dfrac{Xmax_o - Xmin_o}{Ns - 1}$ |
| Intersections | $CircInt(X, Y, R) = \begin{pmatrix} 7.036 + 4.05j \\ 20 - 75j \end{pmatrix}$ | | |
| Actual impedance | $Zt = 20 - 75j$ | | |

Given Zt, the input impedance, or the load seen by the source $$Zi = \frac{U_i}{I_i}$$

can be computed as $$Zi := \frac{Ac_{0,0} \cdot Zt + Ac_{0,1}}{Ac_{1,0} \cdot Zt + Ac_{1,1}}$$

This can be verified by direct computation from the network elements as $$\cfrac{1}{Ym_0 + \cfrac{1}{Zm_0 + \cfrac{1}{Ym_1 + \cfrac{1}{Zm_1 + Zt}}}} = 0.722 + 1.618j$$

In all embodiments of the present invention, the voltage tunable capacitors may be voltage tunable dielectric capacitors to enable the benefits concomitant to use such voltage tunable dielectric capacitors.

Some embodiments of the invention may be implemented, for example, using a machine-readable medium or article which may store an instruction or a set of instructions that, if executed by a machine, for example, by a system of the present invention which includes above referenced controllers and DSPs, or by other suitable machines, cause the machine to perform a method and/or operations in accordance with embodiments of the invention. Such machine may include, for example, any suitable processing platform, computing platform, computing device, processing device, computing system, processing system, computer, processor, or the like, and may be implemented using any suitable combination of hardware and/or software. The machine-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disk Read Only Memory (CD-ROM), Compact Disk Recordable (CD-R), Compact Disk Re-Writeable (CD-RW), optical disk, magnetic media, various types of Digital Versatile Disks (DVDs), a tape, a cassette, or the like. The instructions may include any suitable type of code, for example, source code, compiled code, interpreted code, executable code, static code, dynamic code, or the like, and may be implemented using any suitable high-level, low-level, object-oriented, visual, compiled and/or interpreted programming language, e.Γ., C, C++, Java, BASIC, Pascal, Fortran, Cobol, assembly language, machine code, or the like.

An embodiment of the present invention provides a machine-accessible medium that provides instructions, which when accessed, cause a machine to perform operations comprising minimizing the magnitude of an input reflection coefficient seen at an RFin port under boundary conditions of a variable load impedance ZL by an adaptive antenna impedance matching module (AIMM) by using a tuner connected to said AIMM and including a plurality of voltage tunable capacitors with independent control voltages within said tuner, wherein backward-wave couplers sample incident and reflected waves respectively at the input side of said tuner; and using a microcontroller or digital signal process (DSP) chip to sample complex reflection coefficient information from said incident and reflected waves and providing by said microcontroller or DSP a coarse tune function that feeds approximate bias voltages to control said voltage tunable capacitors. The machine-accessible medium may further comprise the instructions causing the machine to perform operations further comprising sampling the complex reflection coefficient information from at least one analog to digital converter (ADC) by said microcontroller or DSP chip.

Some embodiments of the present invention may be implemented by software, by hardware, or by any combination of software and/or hardware as may be suitable for specific applications or in accordance with specific design requirements. Embodiments of the invention may include units and/or sub-units, which may be separate of each other or combined together, in whole or in part, and may be implemented using specific, multi-purpose or general processors or controllers, or devices as are known in the art. Some embodiments of the invention may include buffers, registers, stacks, storage units and/or memory units, for temporary or long-term storage of data or in order to facilitate the operation of a specific embodiment.

While the present invention has been described in terms of what are at present believed to be its preferred embodiments, those skilled in the art will recognize that various modifications to the disclose embodiments can be made without departing from the scope of the invention as defined by the following claims.

What is claimed is:

1. An apparatus, comprising:
   an adaptive impedance matching module (AIMM) adapted to reduce a magnitude of an input reflection at a first port of the AIMM subject to a variable load impedance at a second port of the AIMM,
   wherein the AIMM comprises a plurality of voltage tunable capacitors with independent control voltages,
   wherein at least one directional coupler samples incident and reflected waves respectively at the first port, and
   wherein a logic unit determines reflection coefficient information from said incident and reflected waves, and follows at least one cycle of a coarse tune process for generating bias voltages to control tuning of the plurality of voltage tunable capacitors.

2. The apparatus of claim 1, wherein the logic unit corresponds to a microcontroller or DSP component that determines the reflection coefficient information from samples provided thereto by at least one analog to digital converter (ADC) coupled to the at least one directional coupler.

3. The apparatus of claim 1, wherein a look-up table is used to perform said coarse tune process, and wherein said bias voltages are directed to a plurality of digital to analog converters (DACs) that in turn control voltage buffers driving said plurality of voltage tunable capacitors.

4. The apparatus of claim 1, wherein said bias voltages generated by the coarse tune process are supplied to a plurality of digital to analog converters (DACs) that in turn control voltage buffers driving said plurality of voltage tunable capacitors.

5. The apparatus of claim 1, wherein the logic unit determines new reflection coefficient information after the at least one cycle of the coarse tune process, and wherein if a magnitude of said new reflection coefficient information has achieved a desired level, then the logic unit fine tunes the plurality of voltage tunable capacitors using small and iterative adjustments to said bias voltages.

6. The apparatus of claim 5, wherein said fine tunings compensates for variations in manufacturing tolerances or temperature variations of the plurality of voltage tunable capacitors.

7. The apparatus of claim 5, wherein said fine tuning conforms to a scalar multi-variable minimization algorithm.

8. The apparatus of claim 7, wherein said multi-variable minimization algorithm corresponds to at least one of:
   a downhill simplex method in multidimensions;
   a conjugate gradient method in multidimensions; and
   a quasi-Newton method.

9. The apparatus of claim 3, wherein a DC-to-DC converter powers said voltage buffers.

10. The apparatus of claim 1, wherein the reflection coefficient information is determined from samples supplied to the logic unit by at least one analog to digital converter (ADC) coupled to the at least one directional coupler, wherein said bias voltages are directed to a plurality of digital to analog converters (DACs) that in turn control voltage buffers driving said plurality of voltage tunable capacitors.

11. The apparatus of claim 1, wherein the plurality of voltage tunable capacitors correspond to at least one of semiconductor varactors, microelectromechanical system (MEMS) varactors, MEMS switched capacitors, semiconductor switched capacitors, and ferroelectric capacitors.

12. The apparatus of claim 1, wherein each of said plurality of voltage tunable capacitors comprises dielectric material having a variable dielectric constant controllable with a bias voltage.

13. A computer-readable storage medium, comprising computer instructions to:
   determine an input reflection coefficient from incident and reflected waves detected at a port of an adaptive impedance matching module (AIMM), wherein the AIMM includes a plurality of voltage tunable capacitors with independent control voltages; and
   coarse tune the plurality of voltage tunable capacitors with bias voltages determined according to the input reflection coefficient.

14. The storage medium of claim 13, comprising computer instructions to perform said course tune according to a look-up table that provides values corresponding to said bias voltages.

15. The storage medium of claim 13, comprising computer instructions to:
   determine a new input reflection coefficient from an additional sampling at the port of the AIMM;
   detect that the new input reflection coefficient achieves a desired level; and
   fine tune the plurality of voltage tunable capacitors using iterative adjustments to said bias voltages.

16. A method, comprising:
   determining a reflection coefficient from a radio frequency signal sampled at a port;
   determining at least one bias voltage from the reflection coefficient; and
   tuning an adaptive impedance matching module (AIMM) with the at least one bias voltage, wherein the AIMM comprises at least one voltage tunable capacitor with at least one independent control voltage.

17. The method of claim 16, comprising tuning according to a coarse tuning process.

18. The method of claim 16, comprising tuning according to a fine tuning process.

* * * * *